United States Patent [19]

Ahanin et al.

[11] Patent Number: 5,166,604
[45] Date of Patent: Nov. 24, 1992

[54] METHODS AND APPARATUS FOR FACILITATING SCAN TESTING OF ASYNCHRONOUS LOGIC CIRCUITRY

[75] Inventors: Bahram Ahanin, Cupertino; Craig S. Lytle, Palo Alto; Ricky W. Ho, Sunnyvale, all of Calif.

[73] Assignee: Altera Corporation, San Jose, Calif.

[21] Appl. No.: 611,974

[22] Filed: Nov. 13, 1990

[51] Int. Cl.⁵ .............................................. G01R 31/28
[52] U.S. Cl. ............................... 324/158 R; 371/22.3; 371/22.6
[58] Field of Search ...................... 371/22.1, 22.2, 22.3, 371/22.6, 25.1; 324/158 R, 73.1

[56] References Cited

U.S. PATENT DOCUMENTS

| | | | |
|---|---|---|---|
| 4,484,329 | 11/1984 | Slamka et al. | 371/25.1 |
| 4,556,840 | 12/1985 | Russell | 371/22.6 |
| 4,580,137 | 4/1986 | Fiedler et al. | 371/22.3 |
| 4,649,539 | 3/1987 | Crain et al. | 371/22.3 |
| 4,701,921 | 10/1987 | Powell et al. | 371/22.3 |
| 4,780,666 | 10/1988 | Sakashita et al. | 371/22.3 |
| 4,856,002 | 8/1989 | Sakashita et al. | 371/22.3 |
| 4,862,068 | 8/1989 | Kawashima et al. | 371/22.3 |
| 4,864,579 | 9/1989 | Kishida et al. | 371/22.3 |
| 5,008,618 | 4/1991 | Van Der Star | 371/22.3 |
| 5,047,710 | 9/1991 | Mahoney | 371/22.3 |

Primary Examiner—Ernest F. Karlsen
Assistant Examiner—William J. Burns
Attorney, Agent, or Firm—Robert R. Jackson; G. Victor Treyz

[57] ABSTRACT

Scan testing of asynchronous logic circuitry is facilitated by gating off the asynchronous inputs to flip-flops during scan testing. If desired, the asynchronous inputs which are gated off in this manner may themselves terminals or scan registers during testing. Alternatively, the asynchronous inputs which are gated could be tested by selectively enabling the signals at strategic points during scan testing. The number of input terminals required to control the test mode may be reduced by providing registers for storing test control signals applied to normal input terminals at the beginning of a test cycle. Once these test control signals are stored, the normal input terminals are free to return to their normal use.

10 Claims, 4 Drawing Sheets

METHODS AND APPARATUS FOR FACILITATING SCAN TESTING OF ASYNCHRONOUS LOGIC CIRCUITRY

BACKGROUND OF THE INVENTION

This invention relates to testing asynchronous logic circuitry, and more particularly to methods and apparatus for facilitating the testing of such circuitry.

Scan testing is a well-known technique for testing synchronous logic circuitry to determine whether or not the circuitry has the design required to enable it to function properly under all circumstances and/or whether the circuitry has been fabricated properly and without defects. However, scan testing assumes that signals such as the clock, preset, and clear of each storage register ("flip-flop") in the logic circuitry come directly from an input terminal (pin) of the circuitry. This is generally not true for asynchronous logic circuitry where one or more of such signals may be generated by logic included in the circuitry to be tested. This makes it impossible to test asynchronous logic either at all or as completely as would be desired using scan testing.

It is therefore an object of this invention to provide methods and apparatus for facilitating the scan testing of asynchronous logic.

It is another object of this invention to provide methods and apparatus for allowing more complete scan testing of asynchronous logic.

SUMMARY OF THE INVENTION

These and other objects of the invention are accomplished in accordance with the principles of the invention by modifying the design of asynchronous logic circuitry to be scan tested so that signals normally applied to such flip-flop inputs as the clock, preset, and clear inputs can be selectively gated off during scan testing of the logic circuitry. Additionally, if desired during testing, a scan clock signal can be applied to flip-flop clock inputs, and signals of predetermined logical value can be applied to flip-flop preset and clear inputs. Other circuit modifications may be made to further facilitate scan testing. For example, the circuitry may be modified so that few, one, or even no input pins must be dedicated to selecting and controlling the test mode. This can be done by providing one or more flip-flops for storing desired test mode control data applied to normal input pins when the circuitry is first put into test mode. Thereafter, this test mode control data can be read out of these flip-flops in order to free all or substantially all of the input pins for return to normal operation. To facilitate observation and testing of the signals which normally go to such destinations as flip-flop clock, preset, and clear inputs and which are gated off during scan testing, these signals may be applied to output terminals of the logic circuitry during testing, e.g., through one or more flip-flops added to the circuitry for this purpose. The number of such added flip-flops may be reduced by feeding signals to them through one or more multiplexers. An alternative technique for observing and testing the gated off signals is to selectively enable the signal and observe its effect on the scan logic.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
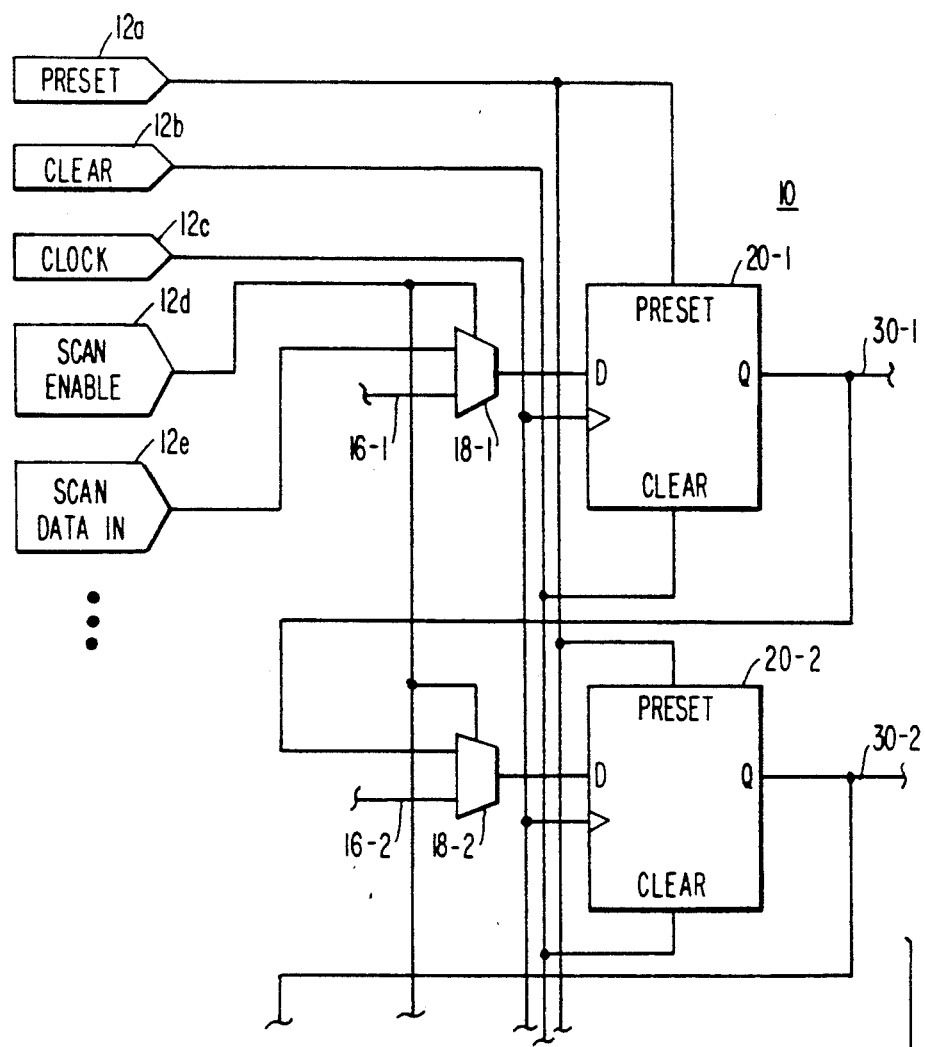
FIG. 1 is a schematic block diagram of a representative portion of prior art synchronous logic circuitry which is arranged to enable scan testing of that logic circuitry.
Figure 1:
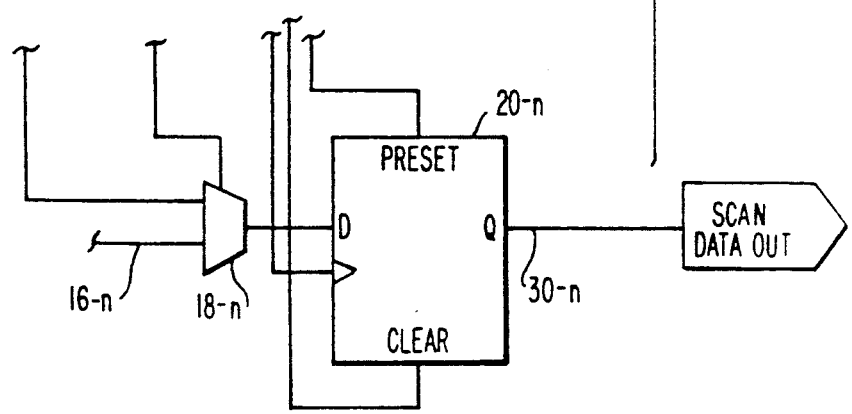

FIG. 1 shows synchronous logic circuitry 10 which has been conventionally adapted for scan testing. Each of flip-flops 20-1 through 20-n is part of the normal logic of circuitry 10 which is to be tested, generally along with other normal logic (not shown) which generates the data signals 16-1 through 16-n normally applied (via the associated one of multiplexers 18-1 through 18-n) to the data (D) input terminals of flip-flops 20, and/or which uses the registered (Q) output signals 30-1 through 30-n of those flip-flops. As is typical for synchronous logic, the preset, clear, and clock signals are respectively common for all of flip-flops 20 and respectively come directly from input terminals 12a-c of the circuitry. In addition, to enable scan testing of the circuitry, the Q output of each flip-flop 20 is connected to the other input terminal of the multiplexer 18 associated with the next flip-flop 20. Multiplexers 18 are controlled by a SCAN ENABLE input signal, and the second input terminal to the first multiplexer 18-1 is connected to a SCAN DATA IN terminal. This provides controllability of the circuit by allowing any desired scan data (entered via the SCAN DATA IN terminal when the SCAN ENABLE signal is high) to be shifted into flip-flops 20. After the desired scan data is shifted in, the normal logic data signals (16-1 through 16-n) can be tested by loading those signals into flip-flops 20 by bringing SCAN ENABLE low and applying the CLOCK signal. The registers 20 can then be observed by bringing SCAN ENABLE back high and shifting the registers out of the SCAN DATA OUT output pin.

Figure 2:
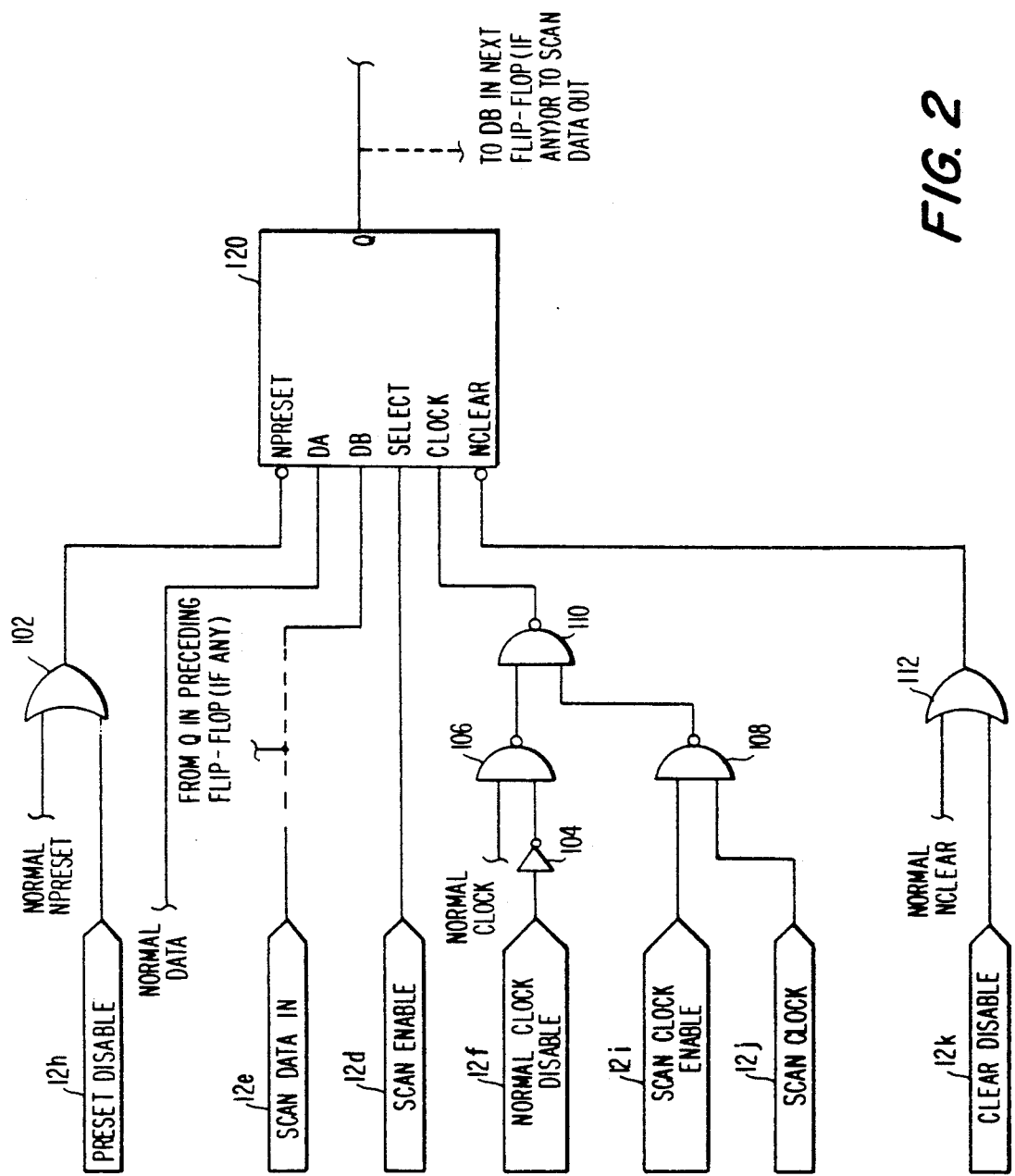
FIG. 2 is a schematic block diagram of a representative portion of asynchronous logic circuitry including elements in accordance with this invention for facilitating scan testing of that logic circuitry.

The foregoing test method can generally not be used for asynchronous logic circuitry because in such logic circuitry some or all of the flip-flop clock, preset, and clear inputs may come from logic which is part of the circuitry, rather than simply from input pins 12 as in FIG. 1. FIG. 2 therefore shows how a typical module of the circuitry of FIG. 1 can be modified in accordance with the principles of this invention to facilitate scan testing exactly as discussed above, even though the module is part of asynchronous logic circuitry.

For simplicity in FIG. 2, a typical multiplexer 18 and the associated flip-flop 20 are combined in a single box 120 which will be referred to simply as flip-flop 120. Also for simplicity, the polarities of the preset and clear signals are reversed in FIG. 2, but those skilled in the art will understand that the polarities of all signals referred to throughout this disclosure are arbitrary. In FIG. 2, the DA and DB signals correspond respectively to the two data signals applied to a typical multiplexer 18 in FIG. 1, and the SELECT signal in FIG. 2 corresponds to the control signal for that multiplexer in FIG. 1.

During normal operation of the apparatus shown in FIG. 2 the PRESET DISABLE, SCAN ENABLE, NORMAL CLOCK DISABLE, SCAN CLOCK ENABLE, and CLEAR DISABLE signals are all low. This allows OR gate 102 to apply the normal NPRESET signal (which may come from logic (not shown) which is part of the logic circuitry) to the NPRESET terminal of flip-flop 120. The normal data signal (also typically from logic (not shown) which is part of the logic circuitry) is applied to the DA terminal of flip-flop 120. The low SCAN ENABLE signal causes flip-flop 120 to select DA as its data input terminal. The low SCAN CLOCK ENABLE signal gates off the SCAN CLOCK signal, while the low NORMAL CLOCK DISABLE signal causes the normal clock signal (which again may come from logic (not shown) which is part of the logic circuitry) to pass through NAND gates 106 and 110 to the clock input terminal of flip-flop 120. Finally, the low CLEAR DISABLE signal allows OR gate 112 to apply the normal NCLEAR signal (which once again may come from logic (not shown) which is part of the logic circuitry) to the NCLEAR terminal of flip-flop 120.

To perform scan testing of the apparatus shown in FIG. 2, the PRESET DISABLE, SCAN ENABLE, NORMAL CLOCK DISABLE, SCAN CLOCK ENABLE, and CLEAR DISABLE signals may all be set high. This prevents the normal NPRESET and normal NCLEAR signals from affecting flip-flop 120. It also causes flip-flop 120 to select DB as its data input terminal. And it causes inverter 104 and NAND gate 106 to block the normal clock signal, while allowing NAND gates 108 and 110 to instead apply the SCAN CLOCK signal to the clock input terminal of flip-flop 120. SCAN DATA IN terminal 12e can now be used in conjunction with a SCAN CLOCK signal applied to input terminal 12j and the SCAN ENABLE signal applied to input terminal 12d to shift any desired test data into flip-flip 120 and the other similar flop-flops connected in a scan chain with it in the manner shown in FIG. 1. The FIG. 2 apparatus therefore allows scan testing of asynchronous logic in the same way that synchronous logic is scan tested in the prior art.

The embodiment shown in FIG. 2 requires a substantial number of input terminals (i.e., 12d, 12e, 12f, and 12h–k) to be dedicated to testing the logic circuitry. Input terminals are often a scarce resource in logic circuit design. One resolution in accordance with this invention is to tie some of the control input terminals together. This has the effect of reducing the number of input terminals required, while somewhat restricting the flexibility of the test logic. Those skilled in the art will appreciate that several combinations of connected inputs are possible and useful. This invention covers all of these combinations and is not limited to the notable cases of: (1) 12h and 12k connected; (2) 12f and 12i connected; or (3) 12h, 12k, 12f, and 12i connected.

Figure 3:
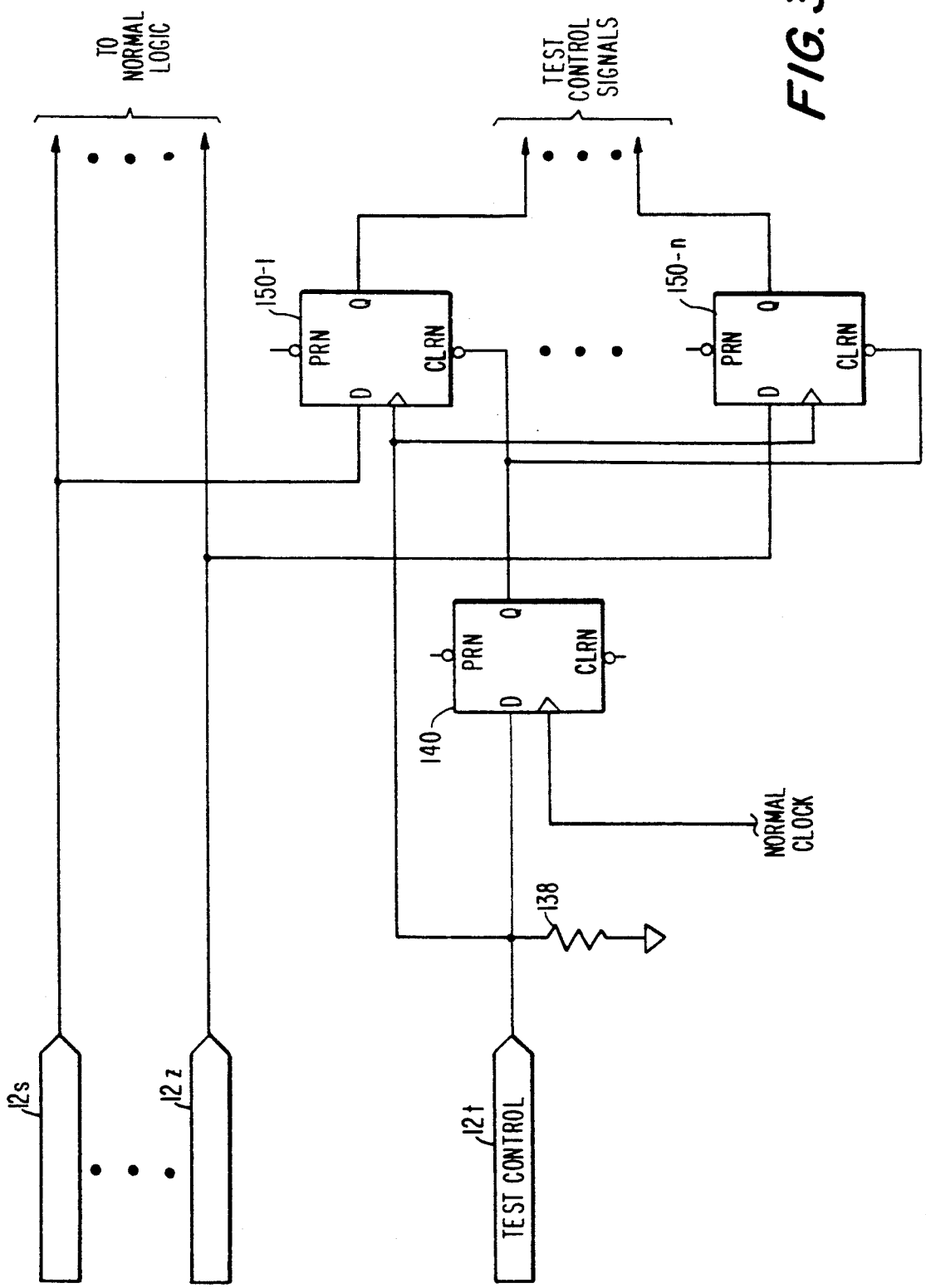
FIG. 3 is a schematic block diagram of additional circuitry constructed in accordance with this invention which can optionally be used in conjunction with circuitry of the type shown in FIG. 2.

FIG. 3 shows additional circuitry constructed in accordance with this invention which can also be used to dramatically reduce the required number of test input terminals. This is accomplished by allowing normal input terminals to receive test control signals which are then stored in test mode registers in the logic circuitry. These stored test control signals are then used to control the test, thereby allowing the input terminals which received them to return to normal use.

In the embodiment shown in FIG. 3 a single TEST CONTROL input terminal 12t is used to control whether or not the logic circuitry is in test mode. The other depicted input terminals 12s–z may be normal data input terminals of the logic circuitry. The data (D) input terminal of test control flip-flop 140 is normally held low by the signal applied to input terminal 12t and the connection of that terminal to ground through resistor 138. This keeps the Q output of flip-flop 140 low, which keeps test control signal storage registers 150-1 through 150-n in the reset state. Input terminals 12s through 12z can therefore be used as normal inputs to the normal logic of the device.

When it is desired to enter the test mode, the TEST CONTROL signal applied to input terminal 12t is raised to logical 1 and the desired test control signals (e.g., PRESET DISABLE, SCAN ENABLE, NORMAL CLOCK DISABLE, SCAN CLOCK ENABLE, and CLEAR DISABLE in the example shown in FIG. 2) are respectively applied to appropriate ones of input terminals 12s through 12z. The high TEST CONTROL signal causes the Q output of flip-flop 140 to rise after the next pulse on the normal clock. This allows the TEST CONTROL signal to clock flip-flops 150 so that each of these flip-flops stores a respective one of the test control signals applied to terminals 12s through 12z. Flip-flops 150 continue to store these signals as long as register 140 remains high. Moreover, the fact that the TEST CONTROL signal is constant prevents flip-flops 150 from receiving further data from input terminals 12s through 12z. Accordingly, after initially being used to supply the test control signals to flip-flops 150, terminals 12s through 12z can be returned to normal use during the balance of the test cycle.

When the test cycle is completed, the TEST CONTROL signal is returned to logical 0 which causes flip-flop 140 to reset all of flip-flops 150 at the next normal clock pulse.

Although the embodiment shown in FIG. 3 still requires one input terminal 12t dedicated to controlling the test mode, even this requirement can be eliminated by using a normally "illegal" combination of two or more normal input signals to indicate that the test mode is desired.

In FIG. 2 the asynchronous inputs to typical flip-flop 120 are gated off during scan testing. Among these gated off asynchronous signals are the normal NPRESET, CLOCK, and NCLEAR signals. With the use of traditional scan-logic circuitry and traditional scan-logic methodology, these gated off signals could not be tested because they do not feed a D-input to one of the scan flip-flops, and they must be constantly gated off during the scan testing. Nevertheless, for adequate testing of the logic circuitry it may be necessary or desirable to be able to observe one or more of these signals.

This invention provides two means of observing the faults at asynchronous inputs to the flip-flop. The first means is a direct result of the circuitry shown in FIG. 2. The second means involves some additional circuitry that will be discussed later.

FIG. 2 shows how each flip-flop's asynchronous inputs, NPRESET, CLOCK, and NCLEAR, are gated off before the flip-flop. It is an important aspect of this invention that the signals controlling the gating of these signals are discrete and can be enabled or disabled at will. To observe the value of these asynchronous inputs all that need be done is to enable the controlling signals at a critical point in the scan testing. The enabled asynchronous input can immediately change the state of the flip-flop. When the flip-flop is later observed by shifting the scan flip-flops out via the SCAN DATA OUT pin, the result of the asynchronous input can be observed. Thus, by enabling various asynchronous inputs to the flip-flops one-by-one or many-at-once, the circuitry driving the asynchronous inputs to flip-flops can be observed.

Another method of observing the asynchronous inputs to the flip-flops in accordance with this invention is accomplished by applying each of these signals to an input terminal of one or more extra flip-flops added to the existing scan chain. In addition, to reduce the number of such extra flip-flops required to observe several signals, some or all of those signals may be applied to a multiplexer so that the signals can be applied to a single flip-flop one after another.

Figure 4:
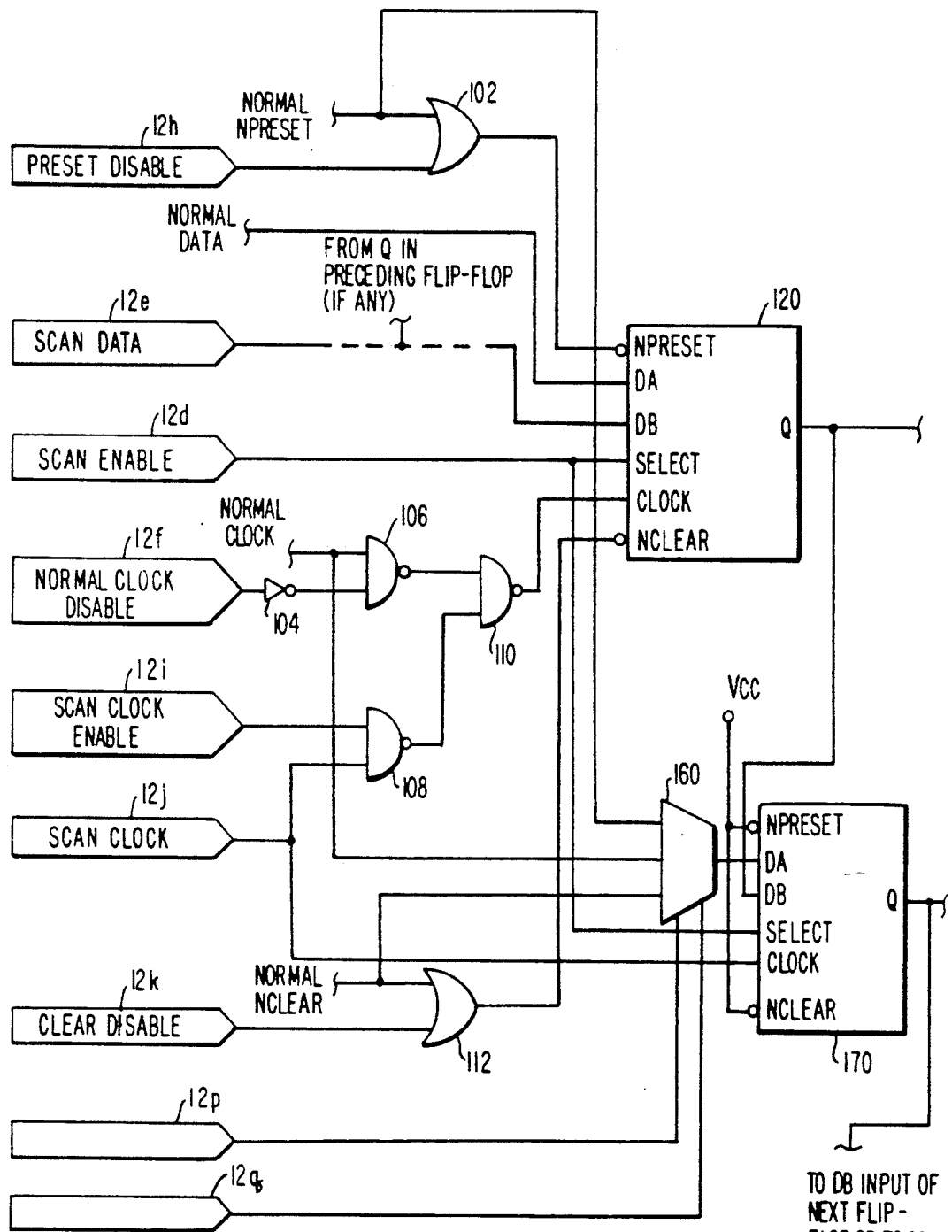
FIG. 4 is a schematic block diagram similar to FIG. 2 showing circuitry which can optionally be added to the FIG. 2 circuitry in accordance with this invention.

This aspect of the invention is illustrated by FIG. 4. All the elements of FIG. 2 are repeated in FIG. 4 with the addition of illustrative elements for allowing the normal NPRESET, CLOCK, and NCLEAR signals to be read out via multiplexer 160 and flip-flop 170 as part of the existing scan chain. Multiplexer 160 is controlled by signals from input terminals 12p and 12q to apply a selected one of the signals applied to the multiplexer to one of the data input terminals (DA) of flip-flop 170. (Flip-flop 170 may be a device similar to device 120.) The DA input of flip-flop 170 is selected when the SCAN ENABLE signal (applied to the SELECT input terminal of flip-flop 170) is logical 0. Flip-flop 170 is clocked by the SCAN CLOCK signal applied to its clock input terminal. The NPRESET and NCLEAR input terminals of flip-flop 170 are tied to VCC (logical 1) to prevent presetting or clearing of the device. Accordingly, during scan testing, flip-flop 170 stores the signal applied to its DA input terminal in response to a SCAN CLOCK pulse and applies this stored signal to the next flip-flop in the scan chain, if one exists, or otherwise to the SCAN DATA OUT output terminal. In this way, each of the signals applied to multiplexer 160 can be observed one after another in successive SCAN CLOCK periods by changing the multiplexer control signals applied to input terminals 12p and 12q.

Those skilled in the art will appreciate that the use of multiplexer 160 is optional, and that separate flip-flops 170 could alternatively be provided for each of the signals applied to multiplexer 160. Similarly, if a multiplexer 160 is provided, it can have any size (e.g., 2 to 1, 4 to 1, 8 to 1, 16 to 1, etc.)

It will be understood that the foregoing is merely illustrative of the principles of this invention, and that various modifications can be made by those skilled in the art without departing from the scope and spirit of the invention. For example, the number of gated-off signals applied to multiplexer 160 in FIG. 4 can be varied depending on which of those signals it is desired to be able to observe during testing.

What is claimed is:

1. Apparatus for facilitating testing of logic circuitry which includes storage register means having at least one asynchronous input selected from the group consisting of a preset input, a clock input, and a clear input, said asynchronous input being normally supplied with a first input signal produced by first logic circuit means, said apparatus comprising:

means for selectively inhibiting application of said first input signal to said asynchronous input when said logic circuitry is to be tested, wherein said means for selectively inhibiting is controlled by a control signal;

means for selectively storing an applied test control input signal and for producing an output signal indicative of the stored signal, said output signal being said control signal; and means for enabling said means for selectively storing in order to store said test control input signal when said logic circuitry is to be tested, wherein said logic circuitry includes at least one normal data signal input terminal, wherein the signal applied to said input terminal may be stored in said storage register means during normal operation of said logic circuitry, and wherein the signal applied to said input terminal is also used as said test control input signal.

2. The apparatus defined in claim 1 wherein said means for selectively inhibiting comprises:

means for selectively applying a signal having a predetermined logical value to said asynchronous input in lieu of said first input signal.

3. The apparatus defined in claim 1 wherein said means for selectively inhibiting comprises:

controllable gate means interposed in circuit relationship between said first logic circuit means and said asynchronous input.

4. The apparatus defined in claim 3 wherein said controllable gate means logically combines said first input signal with a control signal so that said control signal can selectively override said first input signal.

5. The apparatus defined in claim 1 wherein said asynchronous input must be switchable both during normal operation of said logic circuitry and during testing of said logic circuitry, and wherein said means for selectively inhibiting comprises:

a source of a test switching signal; and means for selectively applying said test switching signal to said asynchronous input in lieu of said first input signal.

6. The apparatus defined in claim 5 wherein said asynchronous input is said clock input.

7. The apparatus defined in claim 1 wherein said apparatus further comprises:

means for clearing the stored signal when said logic circuitry is no longer being tested.

8. Apparatus for facilitating testing of logic circuitry which includes storage register means having at least one asynchronous input selected from the group consisting of a present input, a clock input, and a clear input, said asynchronous input being normally supplied with a first input signal produced by first logic circuit means, said apparatus comprising:

means for selectively inhibiting application of said first input signal to said asynchronous input when said logic circuitry is to be tested;

an output terminal; and means for applying said first input signal to said output terminal when said logic circuitry is to be tested, wherein said means for applying comprises:

data storage means for storing data applied to a data input terminal and applying the stored data to said output terminal; and means for connecting said first input signal to said data input terminal when said logic circuitry is to be tested, such that said first input signal may be observed when said logic circuitry is to be tested by connecting said output terminal to an existing scan chain.

9. The apparatus defined in claim 8 wherein a scan clock signal is employed during testing of said logic circuitry, wherein said data storage means has a clock input terminal and stores data applied to said data input terminal in response to the application of a clock signal to said clock input terminal, and wherein said scan clock signal is applied to said clock input terminal.

10. The apparatus defined in claim 8 wherein said first input signal is one of a plurality of signals which are inhibited from application to said storage register means during testing of said logic circuitry, and wherein said means for connecting comprises:
   means for selectively applying any one of said plurality of signals to said data input terminal.

* * * * *